(12) United States Patent
Bergbauer

(10) Patent No.: US 10,840,411 B2
(45) Date of Patent: Nov. 17, 2020

(54) SEMICONDUCTOR LAYER SEQUENCE

(71) Applicant: OSRAM OLED GmbH, Regensburg (DE)

(72) Inventor: Werner Bergbauer, Windberg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/310,726

(22) PCT Filed: Jul. 5, 2017

(86) PCT No.: PCT/EP2017/066725
§ 371 (c)(1),
(2) Date: Dec. 17, 2018

(87) PCT Pub. No.: WO2018/007427
PCT Pub. Date: Jan. 11, 2018

(65) Prior Publication Data
US 2019/0326476 A1 Oct. 24, 2019

(30) Foreign Application Priority Data
Jul. 5, 2016 (DE) .................. 10 2016 112 294

(51) Int. Cl.
*H01L 33/04* (2010.01)
*H01L 33/32* (2010.01)
(Continued)

(52) U.S. Cl.
CPC .......... *H01L 33/32* (2013.01); *H01L 33/0025* (2013.01); *H01L 33/06* (2013.01)

(58) Field of Classification Search
CPC ......... H01L 33/04; H01L 33/32; H01L 33/06; H01S 5/34333; H01S 5/222;
(Continued)

(56) References Cited

U.S. PATENT DOCUMENTS 7,576,363 B2 * 8/2009 Uemura ................. B82Y 20/00
257/101
8,643,037 B2   2/2014 Shim et al.
(Continued)

FOREIGN PATENT DOCUMENTS

CN    101789473 A    7/2010
CN    203850327 U    9/2014
(Continued)

OTHER PUBLICATIONS

Translation of the Written Opinion of the International Searching Authority, dated Oct. 1, 2017 (Year: 2017).*
(Continued)

*Primary Examiner* — Mary A Wilczewski
*Assistant Examiner* — Tsz K Chiu
(74) *Attorney, Agent, or Firm* — Slater Matsil, LLP

(57) ABSTRACT

A semiconductor layer sequence is disclosed. In an embodiment the semiconductor layer sequence includes an n-conducting n-region, a p-conducting p-region and an active zone having at least one quantum well located between the n-region and the p-region, wherein the semiconductor layer sequence includes AlInGaN, wherein the n-region comprises a superlattice, wherein the superlattice has a structural unit which repeats at least three times, wherein the structural unit comprises at least one AlGaN layer, at least one GaN layer and at least one InGaN layer, wherein an intermediate layer is disposed between the active zone and the superlattice, wherein the intermediate layer comprises either n-doped GaN or n-doped GaN together with n-doped InGaN so that the intermediate layer is free of aluminum, and wherein the intermediate layer directly adjoins the active zone and the superlattice.

13 Claims, 2 Drawing Sheets

(51) Int. Cl.
*H01L 33/00* (2010.01)
*H01L 33/06* (2010.01)

(58) Field of Classification Search
CPC .... H01S 5/0213; H01S 5/2009; H01S 5/3407; H01S 5/3216; H01S 5/3086; B82Y 20/00
See application file for complete search history.

(56) References Cited

U.S. PATENT DOCUMENTS

| | | |
|---|---|---|
| 9,853,182 B2 | 12/2017 | Choi et al. |
| 2001/0012308 A1* | 8/2001 | Fukunaga ............... B82Y 20/00 372/45.01 |
| 2002/0036295 A1* | 3/2002 | Nunoue ................ H01L 33/105 257/98 |
| 2002/0056836 A1* | 5/2002 | Sawazaki ............... H01L 33/32 257/13 |
| 2004/0124500 A1* | 7/2004 | Kawagoe ............... H01L 33/32 257/548 |
| 2007/0145406 A1 | 6/2007 | Han et al. |
| 2009/0057694 A1* | 3/2009 | Tsai ........................ H01L 33/12 257/94 |
| 2011/0240957 A1* | 10/2011 | Okuno .................... H01L 33/04 257/13 |
| 2012/0261687 A1 | 10/2012 | Shim et al. |
| 2013/0248818 A1 | 9/2013 | Choi et al. |
| 2014/0191192 A1 | 7/2014 | Han et al. |
| 2015/0221826 A1 | 8/2015 | Yang et al. |
| 2015/0372189 A1* | 12/2015 | Matsuura ................ H01L 33/06 257/13 |
| 2017/0012166 A1 | 1/2017 | Miyoshi |

FOREIGN PATENT DOCUMENTS

| | | |
|---|---|---|
| CN | 105917478 A | 8/2016 |
| DE | 19954242 A1 | 5/2005 |
| EP | 2369643 A2 | 9/2011 |
| JP | 2012222362 A | 11/2012 |
| JP | 2015511407 A | 4/2015 |
| JP | 2015511776 A | 4/2015 |
| KR | 20140002910 A | 1/2014 |
| WO | 2013129812 A1 | 9/2013 |
| WO | 2013147453 A1 | 10/2013 |
| WO | 2014003402 A1 | 1/2014 |

OTHER PUBLICATIONS

International Search Report, dated Sep. 29, 2017 (Year: 2017).*
Machine Translation of WO 2013147453 (Year: 2020).*
Wu, L.W. et al., "Influence of Si-Doping on the Characteristics of InGaN—GaN Multiple Quantum-Well Blue Light Emitting Diodes," IEEE Journal of Quantum Electronics, vol. 38, No. 5, May 2002, 6 pages.

* cited by examiner

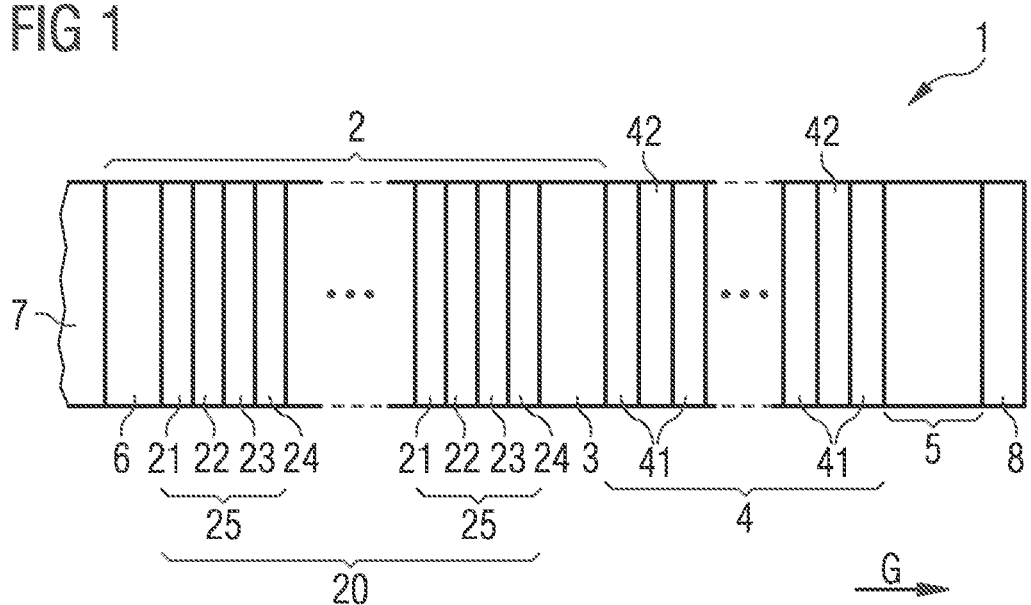
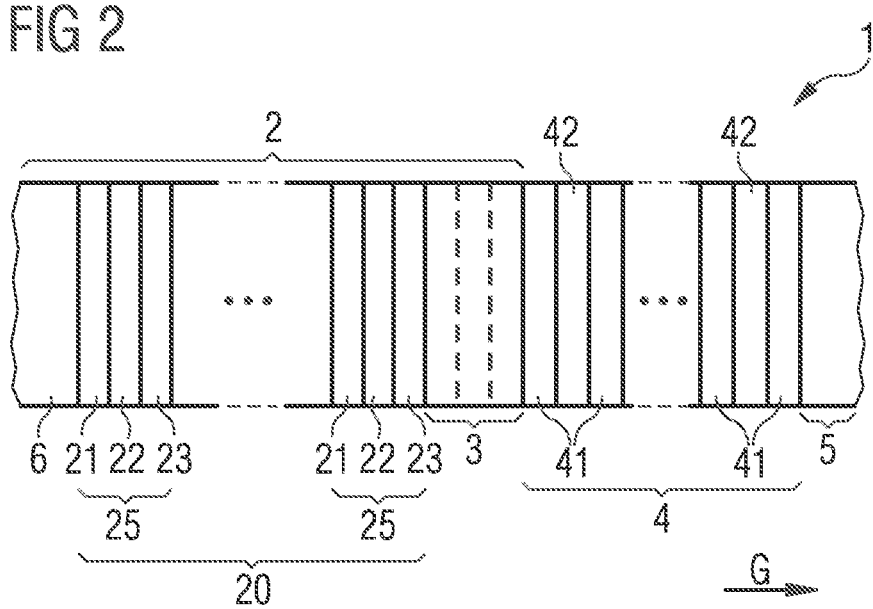

SEMICONDUCTOR LAYER SEQUENCE

This patent application is a national phase filing under section 371 of PCT/EP2017/066725, filed Jul. 5, 2017, which claims the priority of German patent application 102016112294.7, filed Jul. 5, 2016, each of which is incorporated herein by reference in its entirety.

TECHNICAL FIELD

A semiconductor layer sequence is specified.

SUMMARY OF THE INVENTION

Embodiments provide a semiconductor layer sequence that emits near ultraviolet radiation and that has a high efficiency at higher temperatures.

According to at least one embodiment, the semiconductor layer sequence has an n-conducting n-region. The n-region is continuously or at least predominantly n-doped, for example, with silicon and/or germanium. It is possible for thin, undoped layers to be located in the n-region. In this case, 'thin' denotes in particular a thickness of at most 12 nm or 8 nm or 5 nm.

According to at least one embodiment, the semiconductor layer sequence comprises a p-conducting p-region. A p-type doping is produced in particular by magnesium or beryllium. As is also the case for the n-region, the p-region can be continuously p-doped or can comprise thin, undoped layers.

According to at least one embodiment, the semiconductor layer sequence comprises an active zone. The active zone is located between the n-region and the p-region and can directly adjoin the n-region and/or the p-region. One or more quantum wells and/or at least one pn junction are located in the active zone. The active zone is preferably a multi-quantum well structure having a plurality of quantum wells and barrier layers situated therebetween.

According to at least one embodiment, the active zone is designed to generate radiation. The radiation is in particular UVA radiation. A wavelength of maximum intensity of the radiation generated in the intended operation of the active zone is in particular at least 365 nm or 385 nm and/or at most 480 nm or 415 nm or 405 nm or 400 nm.

According to at least one embodiment, the active zone and the semiconductor layer sequence are designed to generate incoherent radiation. In other words, no laser radiation is generated. This means that the semiconductor layer sequence is designed for a light-emitting diode, LED for short. As intended, the semiconductor layer sequence is thus located within a light-emitting diode.

According to at least one embodiment, the semiconductor layer sequence is produced from the III-V compound semiconductor material $Al_nIn_{1-n-m}Ga_mN$, AlInGaN for short, and is based on this material, wherein $0 \leq n \leq 1$, $0 \leq m \leq 1$ and $n+m \leq 1$. If GaN is specified below as the material, then $n=0$ and $m=1$ in the case of AlGaN, $n+m=1$ holds true and $n=0$ holds true for InGaN. The semiconductor layer sequence can have dopants. For the sake of simplicity, however, only the essential components of the crystal lattice of the semiconductor layer sequence are mentioned, that is Al, Ga, In and N, even if these can be partially replaced and/or supplemented by small quantities of further substances. Substances having a concentration of at most $5 \times 10^{16}$ $1/cm^3$ or $2 \times 10^{17}$ $1/cm^3$ are disregarded in the present case and/or are only considered as impurities.

According to at least one embodiment, the n-region comprises a superlattice, in particular exactly one superlattice. In this context, the term "superlattice" means, for example, that a structural unit repeats periodically within the superlattice. In particular, the superlattice has a structural unit which repeats at least three times. The structural unit is preferably repeated identically within the superlattice within the scope of the production tolerances.

According to at least one embodiment, the structural unit is composed of at least one AlGaN layer, at least one GaN layer and at least one InGaN layer. In other words, the structural unit preferably consists of AlGaN layers, GaN layers and InGaN layers. Furthermore, preferably at least a part of the layers of the structural unit is n-doped.

According to at least one embodiment, the structural unit has a thickness of at least 1.5 nm or 2 nm or 3 nm. Alternatively or additionally, the thickness of the structural unit is at most 15 nm or 10 nm or 7 nm. The structural unit preferably has a thickness of at least 4 nm and/or of at most 6 nm.

In at least one embodiment, the semiconductor layer sequence comprises an n-conducting n-region and a p-conducting p-region and an intermediate active zone. The active zone contains at least one quantum well and is designed to generate a radiation. The semiconductor layer sequence is formed from the material system AlInGaN and the n-region comprises a superlattice. The superlattice has a structural unit which repeats at least three times. The structural unit is composed of at least one AlGaN layer, at least one GaN layer and at least one InGaN layer. A thickness of the structural unit is between 2 nm and 15 nm inclusive.

Similarly to electron-blocking layers, layers having a high aluminum content in an n-region can be used to prevent that holes escape into the n-region without a radiating recombination taking place. Furthermore, layers having a high aluminum content can be used as barriers between quantum wells. However, layers having a high aluminum content located directly at an active zone or within an active zone have some disadvantages and difficulties. Thus, layers having a high aluminum content within a GaN matrix lead to tensile stresses and thus to the risk of cracks. By means of lattice mismatches of layers having a high aluminum content, compared to GaN layers, a quality of the semiconductor material can deteriorate. A higher forward voltage is likewise possible. Furthermore, layers having a high aluminum content are generally grown at higher temperatures in order to achieve a sufficient material quality. Higher temperatures can, however, lead to the effect that passivations and reductions in impurities, for instance by means of indium-containing layers, work only to a limited extent or not at all.

By means of the superlattice described here with layers containing aluminum instead of pure InGaN or GaN layers, these disadvantages can be avoided and improved temperature stability can be achieved at the same time. In particular, a hole blocking effect can be achieved by the plurality of AlInGaN layers in the superlattice, while a sufficient distance to a critical thickness of the individual AlGaN layers is given. Furthermore, a passivation effect is provided against metallic impurities, in particular on a wafer surface, by using InGaN layers in the superlattice between AlGaN layers and GaN layers.

According to at least one embodiment, the structural unit is assembled from the following four layers, wherein the four layers are preferably present in the specified sequence and directly follow one another: the AlGaN layer, a first GaN layer, the InGaN layer and a second GaN layer.

According to at least one embodiment, the first and the second GaN layers are of the same design. That is, the first and the second GaN layers do not differ or do not differ significantly with regard to their thicknesses and dopings. Alternatively, it is possible for the first and the second GaN layers to have different thicknesses, wherein preferably the first GaN layer is thicker than the second GaN layer. For example, the thicknesses of the first and second GaN layers differ by at least a factor of 1.5 and/or by at most a factor of 3.

According to at least one embodiment, the structural unit is assembled from the following three layers, wherein the layers are preferably present in the specified sequence and directly follow one another: the AlGaN layer, the GaN layer and the InGaN layer.

According to at least one embodiment, all structural units within the superlattice are of the same design. Alternatively, it is possible for two or more than two types of structural units to be present within the superlattice. For example, one of the structural units can be formed with four layers and a further structural unit is formed with only three layers.

According to at least one embodiment, the structural unit has three, four or more than four partial layers. In particular, the structural unit has at most eight or at most six partial layers.

According to at least one embodiment, the AlGaN layer has an average thickness of at least 0.3 nm or 0.4 nm or 0.6 nm. Alternatively or additionally, the average thickness of the AlGaN layer is at most 8 nm or 5 nm or 3 nm or 2 nm. The thickness of the AlGaN layer is preferably at least 0.6 nm and/or at most 1.5 nm. Within the production tolerances, the AlGaN layer has a constant thickness across the semiconductor layer sequence.

According to at least one embodiment, an average thickness of at least one of the GaN layers or of all GaN layers is at least 0.2 nm or 0.4 nm or 0.6 nm and/or at most 6 nm or 3 nm or 1.5 nm. The GaN layer or the GaN layers preferably have a constant, non-varied thickness across the semiconductor layer sequence.

According to at least one embodiment, an average thickness of the InGaN layer is at least 0.4 nm or 0.6 nm or 0.8 nm. Alternatively or additionally, the InGaN layer has an average thickness of at most 8 nm or 6 nm or 4 nm or 2 nm. Like the other layers of the superlattice, the InGaN layer preferably has a uniform, non-varied thickness.

According to at least one embodiment, an aluminum content of the AlGaN layer is at least 5% or 10% and/or at most 50% or 30% or 25% or 20%. The aluminum content is preferably at least 10% and/or at most 15%. The percentages indicate the value of x in the notation $Al_xGa_{1-x}N$; for example, 20% indicates x=0.2.

According to at least one embodiment, an indium proportion of the InGaN layer is at least 0.5% or 1% or 2%. Alternatively or additionally, the indium proportion is at most 10% or 6% or 4%. The percentages relate to the value y in the notation $In_yGa_{1-y}N$.

According to at least one embodiment, the aluminum content in the AlGaN layer is greater by at least a factor of 3 or 4 or 5 than the indium content in the InGaN layer. Alternatively or additionally, this factor is at most 10 or 8 or 5.

According to at least one embodiment, the AlGaN layer and the InGaN layer have the same thickness. This applies in particular to a tolerance of at most 1 nm or 0.5 nm or 0.2 nm or, within the scope of the manufacturing tolerances and measurement tolerances, exactly.

According to at least one embodiment, the AlGaN layer is undoped.

Alternatively, it is possible for a doping to be introduced into the AlGaN layer, in particular an n-type doping. The entire superlattice can thus be continuously doped, preferably n-doped.

According to at least one embodiment, the InGaN layer and/or one of the GaN layers or all GaN layers of the structural unit of the superlattice are n-doped, in particular with silicon. In this case, a dopant concentration is preferably at least $5 \times 10^{17}$ 1/cm$^3$ or $1 \times 10^{18}$ 1/cm-3. Alternatively or additionally, the dopant concentration is at most $5 \times 10^{19}$ 1/cm$^3$ or $1 \times 10^{19}$ 1/cm$^3$.

According to at least one embodiment, the structural unit is repeated at least 7 times or 10 times or 15 times in the superlattice. Alternatively or additionally, the structural unit is present at most 50 times or 40 times or 30 times in the superlattice. In this case, the individual structural units within the superlattice preferably directly follow one another so that the superlattice can consist of the repeating structural units.

According to at least one embodiment, the superlattice is a hole barrier. In other words, in particular through the AlGaN layers, holes are prevented from being able to pass through the superlattice.

According to at least one embodiment, one or more intermediate layers are located between the active zone and the superlattice. The intermediate layer is preferably n-doped, in particular with the same dopant and the same dopant concentration as the doped layers of the structural unit of the superlattice.

According to at least one embodiment, a distance between the active zone and the superlattice is at least 3 nm or 4 nm or 6 nm and/or at most 30 nm or 20 nm or 12 nm. In other words, the superlattice then does not directly adjoin the active zone.

According to at least one embodiment, the intermediate layer is formed by a GaN layer. Alternatively, it is possible for the intermediate layer to consist of one or more GaN layers and of one or more InGaN layers.

According to at least one embodiment, the intermediate layer is free of aluminum. In other words, the intermediate layer can consist of Ga, N and optionally In, wherein dopings such as silicon are not taken into account.

According to at least one embodiment, the intermediate layer directly adjoins the active zone and the superlattice. It is thus possible for a region between the active zone and the superlattice to be free of aluminum.

BRIEF DESCRIPTION OF THE DRAWINGS

A semiconductor layer sequence described here is explained in more detail below with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

In the figures:

FIGS. 1 and 2 show schematic sectional representations of exemplary embodiments of semiconductor layer sequences;

DETAILED DESCRIPTION OF ILLUSTRATIVE EMBODIMENTS

Figure 3:
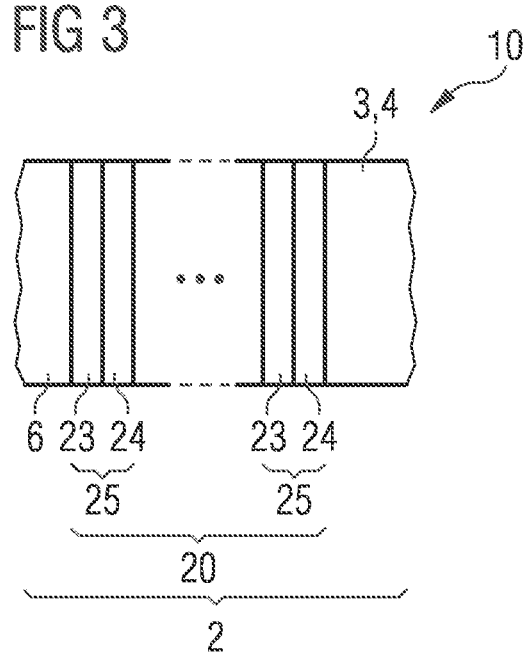
FIG. 3 shows a schematic sectional illustration of a modification of a semiconductor layer sequence.

FIG. 1 shows an exemplary embodiment of a semiconductor layer sequence 1 for a light-emitting diode. The semiconductor layer sequence 1 comprises an n-conducting n-region 2, a p-conducting p-region 5 and an intermediate active zone 4. The p-region 5 is located on a contact 8, which is in particular designed as an anode. The contact 8 can be a layer stack made of metallic layers or of metallic layers together with layers made of transparent conductive oxides such as ITO. In contrast to the illustration in FIG. 1, the p-region 5 can be composed of a plurality of partial layers and can in particular contain an electron barrier layer and a contact layer.

The active zone 4 is a multi-quantum well structure. The active zone 4 has a plurality of quantum wells 41 between which barrier layers 42 are located. The quantum wells 41 are preferably formed from InGaN and are configured to emit radiation having a wavelength L of maximum intensity between 385 nm and 405 nm. The barrier layers 42 are preferably formed from GaN or from a combination of GaN and AlGaN layers. Deviating from the illustration in FIG. 1, a plurality of different barrier layers can also be located between two adjacent quantum wells 41. The active zone 4 can end with one of the quantum wells 41 and start with one of the quantum wells 41. Deviating from the representation in FIG. 1, it is also possible that the active zone 4 ends and/or begins with one of the barrier layers 42.

The n-region 2 comprises a superlattice 20. In the superlattice 20, structural units 25 repeat several times directly along a growth direction G of the semiconductor layer sequence. The structural units 25 are preferably constructed identically to one another, within the scope of the production tolerances.

Each of the structural units 25 has an AlGaN layer 21. A thickness of the AlGaN layer 21 is approximately 1 nm, for example, and an aluminum content is approximately 10%. A first GaN layer 22, which is doped, directly follows the undoped AlGaN layer 21. A thickness of the first GaN layer 22 is approximately 0.5 nm.

The first GaN layer 22 is followed by an n-doped InGaN layer 23. An indium proportion in the InGaN layer 23 is approximately 3% and the thickness thereof is approximately 1 nm. The InGaN layer 23 is directly followed by a second GaN layer 24 which is likewise n-doped and which has a thickness of approximately 0.5 nm.

Deviating from the representation of FIG. 1, structural units 25 having a different structure can also be present in the superlattice 20, wherein preferably all the structural units 25 are of identical design. In addition to the representation shown in FIG. 1, it is possible that the first and second GaN layers 22, 24 have different thicknesses and/or dopings.

Optionally, a further n-doped n-layer 6 is located directly preceding the superlattice 20 along the growth direction G. The n-layer 6 can be, for example, a current spreading layer or a buffer layer. For example, the further n-layer 6 is located directly on a carrier 7, which can be a growth substrate of the semiconductor layer sequence 1.

Optionally, the n-region 2 comprises an intermediate layer 3. The intermediate layer 3 is formed, for example, from GaN and is preferably doped, wherein the intermediate layer 3 can have a higher dopant concentration than the doped layers 22, 23, 24 of the superlattice 20. For example, the intermediate layer 3 is doped with silicon with a dopant concentration of between $1\times10^{19}$ 1/cm$^3$ and $3\times10^{19}$ 1/cm$^3$ inclusive. The intermediate layer 3 preferably directly adjoins the superlattice 20 and the active zone 4, in particular directly adjoins one of the quantum wells 41.

According to FIG. 1, the AlGaN layers 21 are undoped. Alternatively, the AlGaN layers 21 can also be n-doped so that the entire superlattice 20 is then preferably n-doped. The same can also apply in all other exemplary embodiments.

In the exemplary embodiment of FIG. 2, the structural unit 25 is formed by only three partial layers. Thus, the structural unit 25 has in each case the AlGaN layer 21, the GaN layer 22 and the InGaN layer 23.

As in all other exemplary embodiments, the structural unit 25 is preferably repeated at least 15 times and/or at most 25 times, in particular approximately 20 times.

As in all other exemplary embodiments, it is also possible for the intermediate layer 3 to be composed of a plurality of partial layers, in particular of n-doped GaN layers and of n-doped InGaN layers. In this case, relatively highly doped regions can be present within the intermediate layer 3. 'Highly doped' means, for example, a dopant concentration of at least $5\times10^{18}$ 1/cm$^3$ or $1\times10^{19}$ 1/cm$^3$ or $2\times10^{19}$ 1/cm$^3$ and/or of at most $8\times10^{19}$ 1/cm$^3$ or $5\times10^{20}$ 1/cm$^3$. Alternatively or additionally, 'relatively highly doped regions' means that these regions are more highly doped than the layers 22, 23, 24 of the superlattice 20, for example, more highly doped by at least a factor of 2 or 5 or 10.

Otherwise, the exemplary embodiment of FIG. 2 corresponds to that of FIG. 1.

FIG. 3 illustrates a modification 10 of the semiconductor layer sequence. A superlattice 20 is also present in this modification 10, however, the structural units 25 are formed only by two layers, namely by an InGaN layer 23 and a GaN layer 24. In this modification 10, it is possible that there is a separate hole barrier (not shown) between the superlattice 20 and the active zone 4. But such a hole barrier (not shown), formed by one or by two AlGaN layers, leads to a deterioration in the material quality of the active zone 4.

Figure 4:
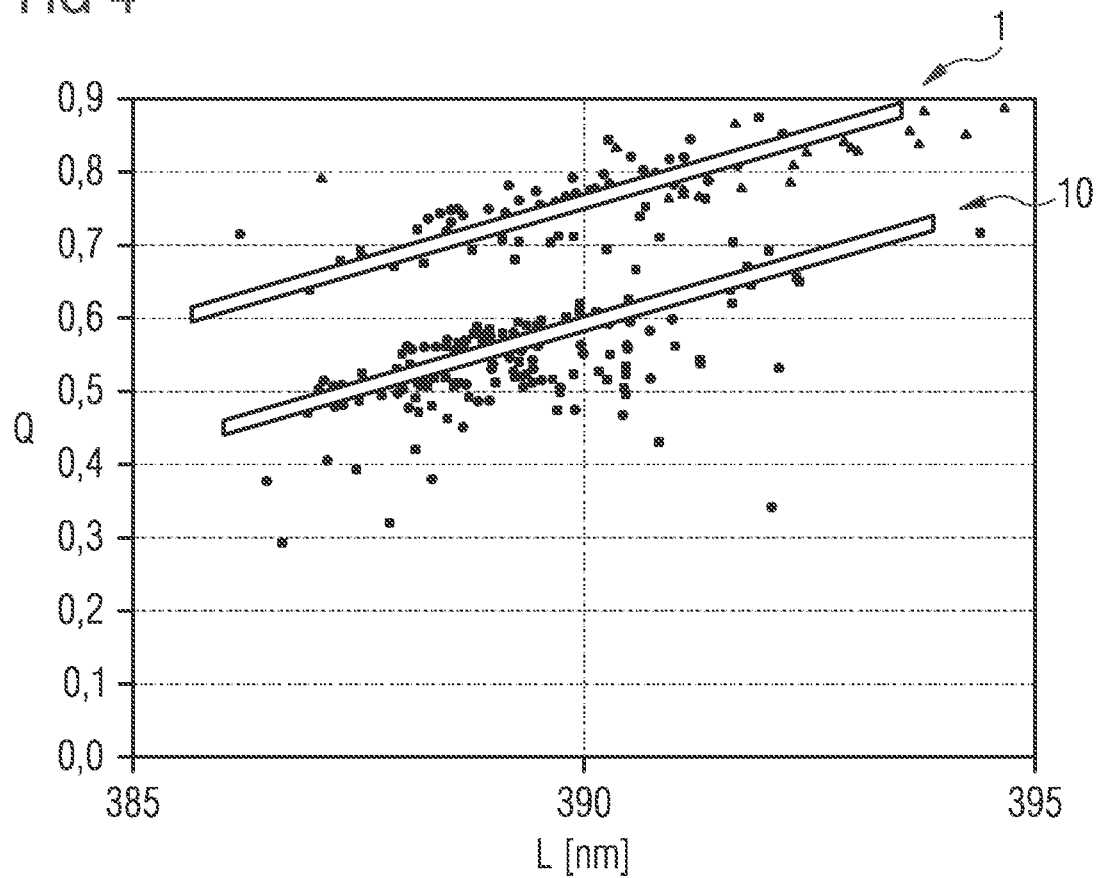
FIG. 4 shows a schematic representation of a dependence of a wavelength of maximum intensity of an emitted radiation on an efficiency.

In FIG. 4, a quotient Q is shown as a function of the wavelength L of maximum intensity of the radiation generated in the active zone 4. The quotient Q denotes a luminous flux at a temperature of the active zone of 120° C. divided by a luminous flux at a temperature of the active zone of 25° C. In FIG. 4, the semiconductor layer sequence 1 of FIG. 1 is compared in particular with the modification 10 of FIG. 3. It can be seen in FIG. 4 that at higher temperatures of the active zone 4, the semiconductor layer sequence 1 described here has a higher efficiency relative to the modification 10.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:
1. A semiconductor layer sequence comprising:
an n-conducting n-region;
a p-conducting p-region; and
an active zone having at least one quantum well located between the n-region and the p-region, the active zone being configured to generate radiation,
wherein the semiconductor layer sequence comprises AlInGaN,
wherein the n-region comprises a superlattice,
wherein the superlattice has a structural unit which repeats at least three times, wherein the structural unit comprises at least one AlGaN layer, at least one GaN layer and at least one InGaN layer, wherein the structural unit has a thickness of at least 2 nm and at most 15 nm, wherein an intermediate layer is disposed between the active zone and the superlattice and a distance between the active zone and the superlattice is at least 4 nm and at most 20 nm, wherein the intermediate layer comprises either n-doped GaN or n-doped GaN together with n-doped InGaN so that the intermediate layer is free of aluminum, wherein the intermediate layer directly adjoins the active zone and the superlattice, wherein the intermediate layer is composed of n-doped GaN layers and of n-doped InGaN layers, and wherein the intermediate layer comprises highly doped regions with a dopant concentration of at least $5 \times 10^{18}$ 1/cm$^3$.

2. The semiconductor layer sequence according to claim 1, wherein the structural unit is composed of the following four layers in the specified immediate sequence:
the AlGaN layer, a first GaN layer, the InGaN layer, and a second GaN layer.

3. The semiconductor layer sequence according to claim 2, wherein the first and the second GaN layers are of the same design.

4. The semiconductor layer sequence according to claim 2, wherein the first and the second GaN layers have different thicknesses.

5. The semiconductor layer sequence according to claim 1, wherein the structural unit is composed of the following three layers in the specified immediate sequence: the AlGaN layer, the GaN layer, and the InGaN layer.

6. The semiconductor layer sequence according to claim 1, wherein an average thickness of the AlGaN layer is between 0.4 nm and 5 nm inclusive, wherein an average thickness of at least one GaN layer is between 0.2 nm and 3 nm inclusive, wherein an average thickness of the InGaN layer is between 0.6 nm and 6 nm inclusive, and wherein the AlGaN layer is thicker than the at least one GaN layer.

7. The semiconductor layer sequence according to claim 1, wherein an aluminum content of the AlGaN layer is between 5% and 30% inclusive and an indium content of the InGaN layer is between 0.5% and 10% inclusive, and wherein the aluminum content is greater than the indium content.

8. The semiconductor layer sequence according to claim 7, wherein the aluminum content of the AlGaN layer is between 10% and 20% inclusive and the indium content of the InGaN layer is between 1% and 6% inclusive, and wherein the AlGaN layer and the InGaN layer are of equal thickness with a tolerance of at most 0.5 nm.

9. The semiconductor layer sequence according to claim 1, wherein the AlGaN layer is undoped and the InGaN layer and the at least one GaN layer are n-doped with silicon with a dopant concentration of between $1 \times 10^{18}$ 1/cm$^3$ and $1 \times 10^{19}$ 1/cm$^3$ inclusive.

10. The semiconductor layer sequence according to claim 1, wherein the structural unit is repeated at least seven times and at most 30 times, and wherein the superlattice consists of the recurring structural units which directly follow one another.

11. The semiconductor layer sequence according to claim 1, wherein the superlattice is a barrier for holes so that holes cannot pass through the superlattice.

12. The semiconductor layer sequence according to claim 1, wherein the active zone is configured to generate the radiation having a wavelength of maximum intensity between 365 nm and 405 nm inclusive, and wherein the radiation is incoherent radiation and the semiconductor layer sequence is a light-emitting diode.

13. The semiconductor layer sequence according to claim 1, wherein the intermediate layer consists essentially of doped GaN and has a higher dopant concentration than the doped layers of the superlattice.

* * * * *